(12) United States Patent
Hsu et al.

(10) Patent No.: US 8,237,273 B2
(45) Date of Patent: Aug. 7, 2012

(54) METAL POST CHIP CONNECTING DEVICE AND METHOD FREE TO USE SOLDERING MATERIAL

(75) Inventors: Hung-Hsin Hsu, Hsinchu (TW); Chih-Ming Ko, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 404 days.

(21) Appl. No.: 12/717,591

(22) Filed: Mar. 4, 2010

(65) Prior Publication Data
US 2011/0215467 A1 Sep. 8, 2011

(51) Int. Cl.
*H01L 23/498* (2006.01)
(52) U.S. Cl. .......... 257/737; 257/778; 257/E23.06; 438/121
(58) Field of Classification Search .......... 257/737, 257/686, 697, 778, E23.06, E21.509; 438/121
See application file for complete search history.

(56) References Cited

U.S. PATENT DOCUMENTS

| | | | | |
|---|---|---|---|---|
| 5,418,471 A | * | 5/1995 | Kardos | 324/756.05 |
| 5,841,190 A | * | 11/1998 | Noda et al. | 257/678 |
| 5,932,891 A | * | 8/1999 | Higashi et al. | 257/48 |
| 6,229,220 B1 | | 5/2001 | Saitoh et al. | |
| 8,021,921 B2 | * | 9/2011 | Lin et al. | 438/108 |
| 8,115,319 B2 | * | 2/2012 | Hsu et al. | 257/778 |

* cited by examiner

*Primary Examiner* — Roy Potter
(74) *Attorney, Agent, or Firm* — Muncy, Geissler, Olds & Lowe, PLLC

(57) ABSTRACT

A metal post chip connecting device without soldering materials is revealed, primarily comprising a chip and a substrate. A plurality of metal pillars are disposed on and extruded from a surface of the chip where each metal pillar has an end surface and two corresponding parallel sidewalls. The substrate has an upper surface and a plurality of bonding pads disposed on the upper surface where each bonding pad has a concaved bottom surface and two corresponding concaved sidewalls. The chip is bonded onto the upper surface of the substrate through heat, pressure, and ultrasonic power so that the end surfaces of the metal pillars self-solder to the concaved bottom surfaces and two parallel sidewalls of the metal pillars partially self-solder to two concaved sidewalls to form U-shape cross-sections of metal bonding between the metal pillars and the bonding pads. Therefore, there is no need for the conventional solder paste as chip connection to increase conductivity of the soldering points, especially, to save the soldering cost for MPS-C2 products and to greatly enhance the bonding strength of the soldering points. The manufacturing method of the above described metal post chip connecting device is also revealed.

10 Claims, 5 Drawing Sheets

METAL POST CHIP CONNECTING DEVICE AND METHOD FREE TO USE SOLDERING MATERIAL

FIELD OF THE INVENTION

The present invention relates to a semiconductor device, and more particularly to a metal post chip connecting device and a method free to use soldering materials.

BACKGROUND OF THE INVENTION

Flip-chip technology is an advanced chip packaging technology to shorten the signal transmission distance between a chip and a substrate leading to better electrical performance than the conventional wire-bonding interconnection which makes flip-chip technology becomes more popular for high-speed semiconductor applications. Especially, IBM was the first to develop an innovated flip-chip technology where metal pillars are implemented to replace the conventional solder balls. Solder pastes are implemented to joint the metal pillars of a chip to the bonding pads of a substrate without changing bump shapes as the conventional solder balls during reflow, therefore, the bump pitches between metal pillars can further be reduced below 50 μm such as 30 μm to achieve higher density of bump layout. In some package products, RDL (redistribution layer) on chip can be eliminated. This technology is called MPS-C2 (Metal Post Solder-Chip Connection), the related package structure is disclosed in U.S. Pat. No. 6,229,220 B1 titling "Bump Structure, Bump Forming Method and Package Connecting Body"

As shown in FIG. 1, a conventional MPS-C2 flip-chip package 100 primarily comprises a chip 110 and a substrate 120. A plurality of metal pillars 112 are disposed on the chip 110 and extruded from the active surface of the chip 110. A plurality of bonding pads 122 corresponding to the metal pillars 112 are disposed on an upper surface 121 of the substrate 120. The metal pillars 112 are bonded to the bonding pads 122 by a plurality of solder pastes 150. Furthermore, an underfilling material 140 is formed to encapsulate the metal pillars 112, the bonding pads 122, and the solder pastes 150 where the solder pastes 150 serve as the soldering interface to electrically connect the chip 110 to the substrate 120. Since the material as well as the melting point of the solder pastes 150 are quite different from these of the metal pillars 112 and the bonding pads 122, the risk of breaking of soldering points and increasing of electrical resistance becomes higher.

The conventional MPS-C2 technology implements solder pastes 150 to mechanically and electrically connect the chip 110 to the substrate 120 where the solder pastes 150 can be chosen from low-temperature soldering materials which are different from the metal pillars 112. Since metal interdiffusion and wettability between different materials are very crucial to ensure good mechanical and electrical connections, Ni/Au are normally disposed on the surfaces of the metal pillars 112 leading to higher soldering cost. Furthermore, the solder pastes 150 are heated to the reflow temperature during the following reflow processes, the solder pastes 150 melt and become fluid where the flooding of the melting solder paste 150 easily occur when under compression or vibration caused the metal pillars 112 soldering to wrong bonding pads 122 leading to electrical failure.

SUMMARY OF THE INVENTION

The main purpose of the present invention is to provide a metal post chip connecting device and a method free to use soldering materials where the conventional solder pastes are not needed for chip interconnection to increase electrical conductivity of the soldering points, especially, to save the soldering cost for MPS-C2 products.

The second purpose of the present invention is to provide a metal post chip connecting device and a method free to use soldering materials. U-shape cross-sections of metal bonding are built to greatly enhance the bonding strength of the soldering points.

According to the present invention, a metal post chip connecting device is revealed, primarily comprising a chip and a substrate. A plurality of metal pillars are disposed on and extruded from a surface of the chip where each metal pillar has an end surface and two corresponding parallel sidewalls. The substrate has an upper surface and a plurality of bonding pads disposed on the upper surface where each bonding pad has a concaved bottom surface and two corresponding concaved sidewalls. The chip is bonded onto the upper surface of the substrate where the end surfaces of the metal pillars self-solder to the concaved bottom surfaces and two parallel sidewalls of the metal pillars partially self-solder to two concaved sidewalls to form U-shape cross-sections of metal bonding between the metal pillars and the bonding pads. The manufacturing method of the above described metal post chip connecting device is also revealed.

The metal post chip connecting device and its manufacturing method according to the present invention have the following advantages and functions:

1. Each metal pillar has an end surface and two corresponding parallel sidewalls and each bonding pad has a concaved bottom surface and two corresponding concaved sidewalls. Through the self-soldering combination of the metal pillars and the bonding pads as a technical mean, the end surfaces of the metal pillars self-solder to the concaved bottom surfaces and two parallel sidewalls of the metal pillars partially self-solder to two concaved sidewalls to form U-shape cross-sections of metal bonding between the metal pillars and the bonding pads. Therefore, there is no need for the conventional solder pastes as chip interconnection to increase electrical conductivity of the soldering points, especially, to save the soldering cost for MPS-C2 products.

2. Through the specific self-soldering combination of the metal pillars and the bonding pads is used as a technical mean, U-shape cross-sections of metal bonding between the metal pillars and the bonding pads can be formed by implementing heat, pressure, and ultrasonic power exerted on the chip to greatly enhance the bonding strength of the soldering points.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

Figure 1:
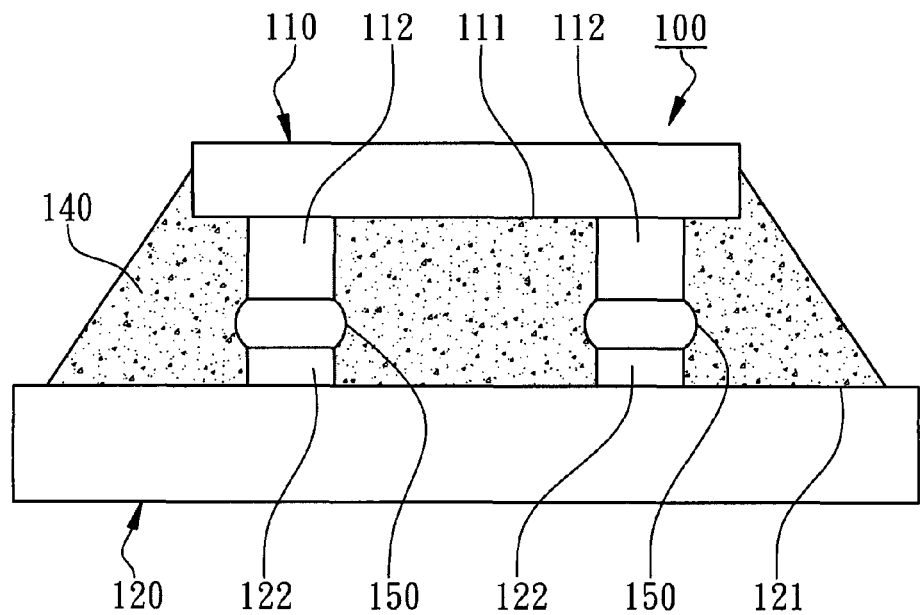
FIG. 1 is a cross-sectional view of a conventional MPS-C2 device.
Figure 2:
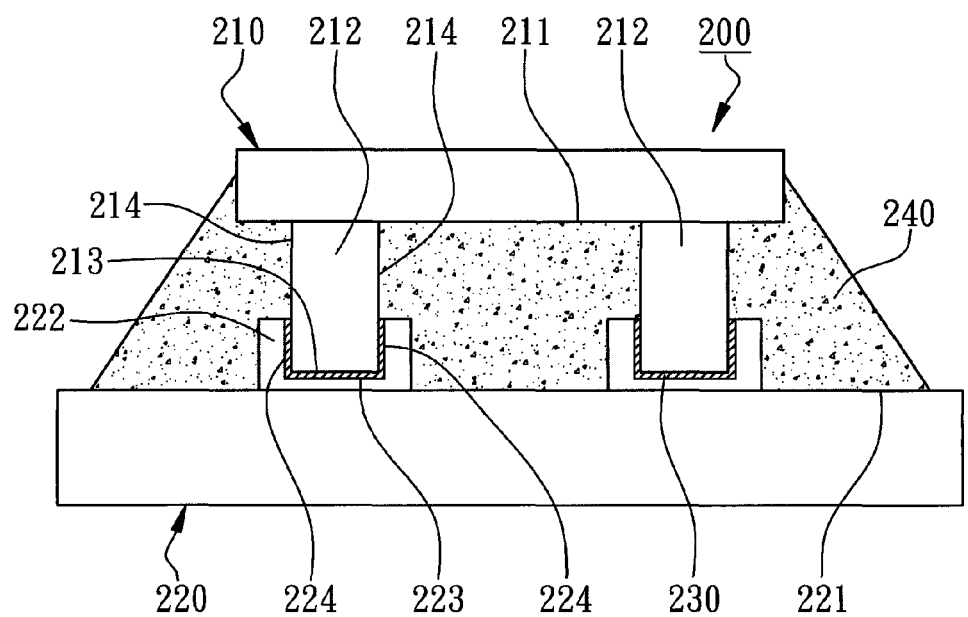
FIG. 2 is a cross-sectional view of a metal post chip connecting device according to the first embodiment of the present invention.
Figure 3A:
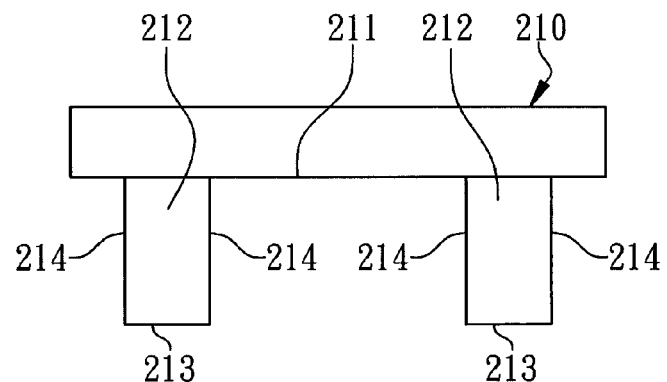
FIG. 3A to FIG. 3C are cross-sectional views illustrating the components of the metal post chip connecting device during flip-chip bonding processes according to the first embodiment of the present invention.
Figure 3B:
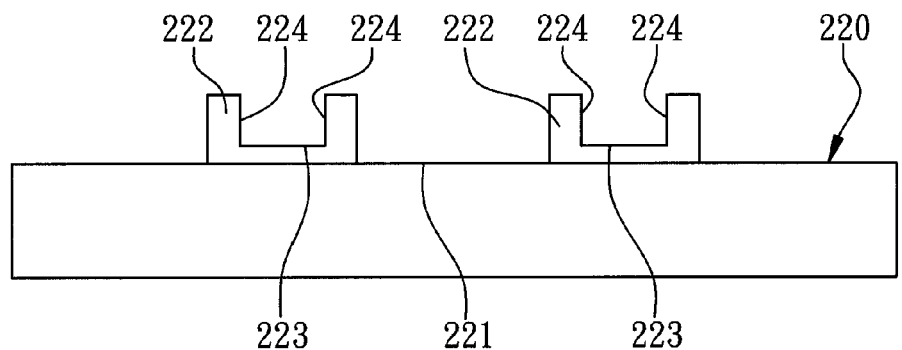
Figure 3C:
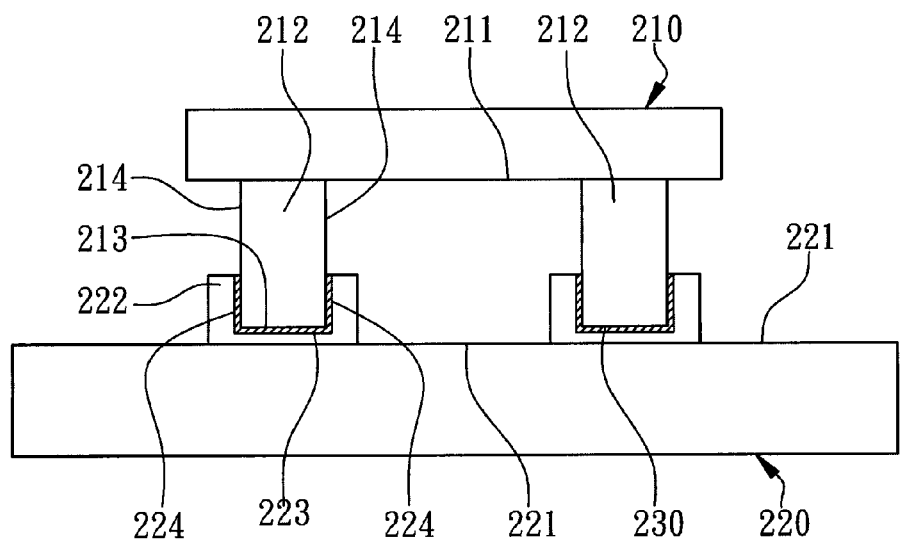

According to the first embodiment of the present invention, a metal post chip connecting device is illustrated in FIG. 2 for a cross-sectional view and its components during flip-chip bonding processes from FIG. 3A to FIG. 3C for cross-sectional views. The metal post chip connecting device 200 primarily comprises a chip 210 and a substrate 220.

As shown in FIG. 2, a plurality of metal pillars 212 are protrusively disposed on and extruded from a surface 211 of the chip 210 where each metal pillar 212 has an end surface 211 and two corresponding parallel sidewalls 214. To describe in depth, ICs are fabricated on the chip 210 such as memory, logic, and ASIC where the chip 210 is singulated from a wafer. In the present embodiment, the surface 211 of the chip 210 is an active surface, i.e., the surface where ICs are fabricated. To further describe in detail, a plurality of bonding pads are formed on the surface 211 (the active surface) which is not shown in the figures to dispose the metal pillars 212 where UBM is disposed between the bonding pads and the metal pillars 212 to avoid metal diffusion. The materials of the metal pillars 212 include gold, copper, aluminum, or their alloys which can be formed into metal pillars by electroplating. Preferably, the end surface 213 of the metal pillar 212 can be planarized by lapping or by other surface planarization methods to make all the metal pillars 212 have the same height.

The substrate 220 has an upper surface 221 and a plurality of bonding pads 222 disposed on the upper surface 221 where each bonding pad 222 has a concaved bottom surface 223 and two corresponding concaved sidewalls 224. To describe in detail, the substrate 220 is a printed circuit board to be a vehicle as a chip carrier and as a electrical-connecting medium. In a preferred embodiment, the distance between two concaved sidewalls 224 of each bonding pad 222 is not greater than the distance between two parallel sidewalls 214 of each corresponding metal pillar 212 to ensure that the parallel sidewalls 214 can touch and rub against the concaved sidewalls 224. The material of the bonding pads 222 contains copper where the concaved bottom surface 223 and two concaved sidewalls 224 are formed by patterned etching or by patterned electroplating. In a preferred embodiment, the cavity depth of the bonding pads 222 is not greater than one-third of the height of the corresponding metal pillars 212 to avoid over-embedding of the metal pillars 212 into the bonding pads 222 and to keep a bonding gap between the chip 210 and the substrate 220 without touching each other. Furthermore, in the present embodiment, the metal pillars 212 and the bonding pads 222 have the same material such as the metal pillars 212 are copper posts and the bonding pads 222 are copper cavities.

Furthermore, the chip 210 is bonded onto the upper surface 221 of the substrate 220 where the end surfaces 213 of the metal pillars 212 self-solder to the concaved bottom surfaces 223 of the bonding pads 222 and where two parallel sidewalls 214 of the metal pillars 212 partially self-solder to two concaved sidewalls 224 to form U-shape cross-sections of metal bonding 230 between the metal pillars 212 and the bonding pads 222. In other words, U-shape cross-sections of metal bonding 230 comprise at least three bonding interfaces located on different planes. The above described "bonding interfaces" locates between the end surface 213 and the concaved bottom surface 223 and between two parallel sidewalls 214 and two corresponding concaved sidewalls 224. "Self-soldering" means the metal pillars 212 form metal bonding with the bonding pads 222 through the diffusion of the activated metal atoms of the metal pillars 212 without any external solder paste, bumps, or adhesives. Basically, intermittent metal lattice interfaces is formed along the U-shape cross-sections of metal bonding 230 so that the electrical resistance between the metal pillars 212 and the bonding pads 222 does not increase after self-soldering to achieve better conductivity through U-shape cross-sections of metal bonding 230. In the present embodiment, the U-shape cross-sections of metal bonding 230 can be copper-to-copper interfaces or gold-to-gold interfaces where the cost of copper-to-copper interfaces is less. Therefore, the U-shape cross-sections of metal bonding 230 do not have any other impurities, fragile casted interfaces, nor inter-metallic compounds (IMC) to easily form uniform bonding interfaces without any interstices. Moreover, in the present invention, the conventional solder pastes as the chip interconnections to increase conductivity of soldering points are not necessary.

In addition, the metal post chip connecting device 200 further comprises an underfill material 240 formed between the chip 210 and the substrate 220 to encapsulate the metal pillars 212. Any voids between the chip 210 and the substrate 220 can be eliminated through the high mobility of the underfill material 240 before curing. In a preferred embodiment, the underfill material 240 can be chosen from materials with higher hardness after curing to protect the metal pillars 212 as well as to reinforce overall package structures.

Therefore, through the specific combination of the metal pillars and the bonding pads as a technical mean, there is no need for the conventional solder paste as chip interconnection to increase conductivity of the soldering points, especially, to save the soldering cost for MPS-C2 products. Basically this is because each metal pillar 212 has one end surface 213 and two corresponding parallel sidewalls 214 and each bonding pad 222 has one concaved bottom surface 223 and two corresponding concaved sidewalls 224 where the end surfaces 213 of the metal pillars 212 self-solder to the corresponding concaved bottom surfaces 223 and two parallel sidewalls 214 of the metal pillars 212 partially self-solder to two corresponding concaved sidewalls 224 to form U-shape cross-sections of metal bonding 230 between the metal pillars 212 and the bonding pads 222. Therefore, the bonding strengths and conductivity of the soldering points can be greatly increased and the risk of breaking of soldering points and increasing of electrical resistance can be avoided.

The method of manufacturing the metal post chip connecting device is also revealed in the present invention which is feasible but not limited and is illustrated from FIG. 3A to FIG. 3C for cross-sectional views to clearly explain the major benefits of the present invention where the detail process flow is described as follows.

Firstly, as shown in FIG. 3A, the first step is to provide a chip 210 where a plurality of metal pillars 212 are disposed on and extruded from a surface 211 of the chip 210 where each metal pillar 212 has an end surface 211 and two corresponding parallel sidewalls 214. The end surfaces 213 do not need the conventional solder paste so that the solder paste contamination issues can be eliminated and the cost of disposing solder paste also can be reduced.

As shown in FIG. 3B, the second step is to provide a substrate 220 where a plurality of a plurality of bonding pads 222 are disposed on the upper surface 221. Each bonding pad 222 has a concaved bottom surface 223 and two corresponding concaved sidewalls 224. To be more specific, each concaved bottom surface 223 with two corresponding concaved sidewalls 224 form a U-shape groove structure.

As shown in FIG. 3C, the third step is to execute flip-chip bonding processes where the chip 210 is flip-chip bonded onto the upper surface 221 of the substrate 220. Through a thermal compression tool with chucking functions (not shown in the figures), heat, pressure, and ultrasonic power is exerted on the chip 210 so that the end surfaces 213 of the metal pillars 212 self-solder to the concaved bottom surfaces 223 and two parallel sidewalls 214 partially self-solder to two corresponding concaved sidewalls 224 to form U-shape cross-sections of metal bonding 230 between the metal pillars 212 and the bonding pads 222. The "ultrasonic power" means the vibration frequency is not less than 2 MHz to exert 20,000 to 40,000 high-frequency lateral vibration to the chip 210 and to the corresponding metal pillars 212 so that atom-level metal bonding is formed at the contact interfaces between the metal pillars 212 and the bonding pads 222 due to atom interdiffusion induced by high-frequency vibration. Therefore, in the present invention, there is no need to apply fluxes nor to huge heat and electrify the metal pillars 212 to the melting points but just appropriately heat the chip 210 without reaching the melting points of the metal pillars 212 to thermally expand the metal pillars 212 disposed on the chip 210 to achieve chip interconnection through self-soldering. The distance between two corresponding parallel sidewalls 214 of each metal pillar 212 is slightly greater than the distance between two corresponding concaved sidewalls 224 of the bonding pads 222 to increase the partial mechanical contact and friction between two parallel sidewalls 214 of the metal pillars 212 and two concaved sidewalls 224 to achieve vertical self-soldering through the sidewalls. Through applying pressure to the chip 210, to ensure that the end surface 213 of each metal pillar 212 can touch and rub against the concaved bottom surface 223 to achieve horizontal self-soldering. Then, U-shape cross-sections of metal bonding 230 between the metal pillars 212 and the bonding pads 222 can be formed by implementing heat, pressure, and ultrasonic power on the chip 210 to greatly enhance the bonding strength of the soldering points.

Figure 4A:
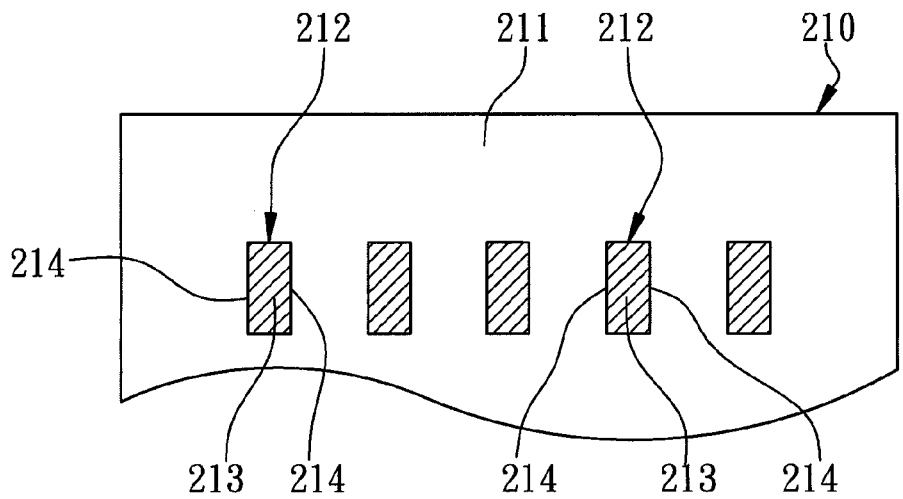
FIG. 4A and FIG. 4C are top views illustrating the metal pillars, the bonding pads and their combinations of the metal post chip connecting device during flip-chip bonding processes according to the first embodiment of the present invention.
Figure 4B:
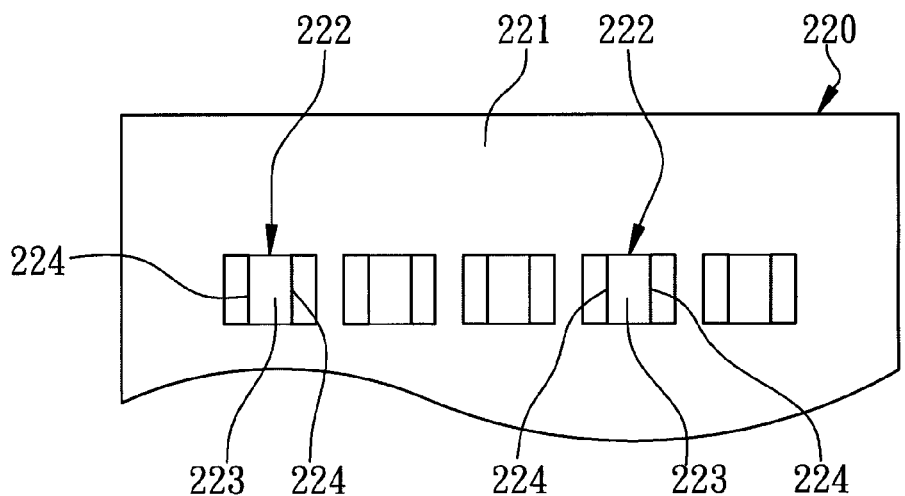
Figure 4C:
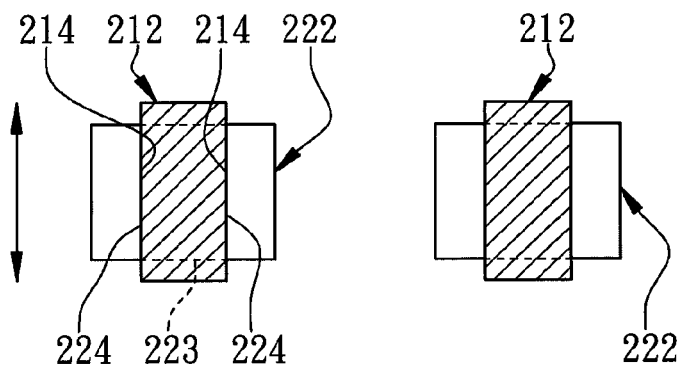

The metal pillars and the bonding pads of the metal post chip connecting device 200 are shown from FIG. 4A to FIG. 4C for top views. As shown in FIG. 4A, the end surface 213 of each metal pillar 212 can be rectangular and each metal pillar 212 not only has the above described two parallel sidewalls 214 but also has another pair of parallel sidewalls to make the metal pillar 212 to be cuboid. Furthermore, as shown in FIG. 4B and FIG. 4C, the dimension of the concaved bottom surface 223 of each bonding pad 222 can not be greater than the dimension of the corresponding end surface 213 of each metal pillar 212. To be more specific, when the metal pillars 212 is flip-chip bonded to the bonding pads 222 through applying heat, pressure and ultrasonic power to the chip 210, the end surfaces 213 and the corresponding concaved bottom surfaces 223 and the parallel sidewalls 214 and the corresponding concaved sidewalls 224 experience high-frequency vibration rubbing against each other so that the end surfaces 213 of the metal pillars 212 self-solder to the corresponding concaved bottom surface 223 of the bonding pads 222 and two parallel sidewalls 214 of the metal pillars 212 partially self-solder to two corresponding concaved sidewalls 224 of the bonding pads 222. The direction pointed by the arrow is the vibration direction of ultrasonic power which is parallel to the parallel sidewalls 214 and the concaved sidewalls 224.

Figure 5A:
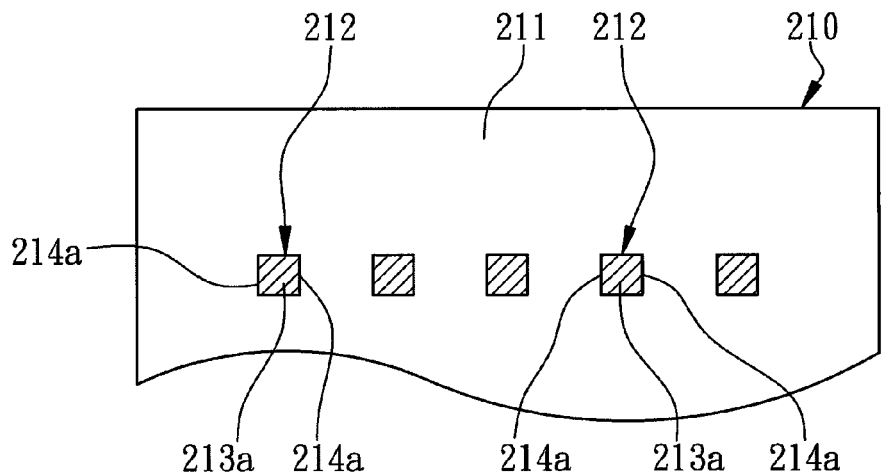
FIG. 5A and FIG. 5C are top views illustrating the metal pillars, the bonding pads and their combinations of the metal post chip connecting device during flip-chip bonding according to one of the variation of the first embodiment of the present invention.
Figure 5B:
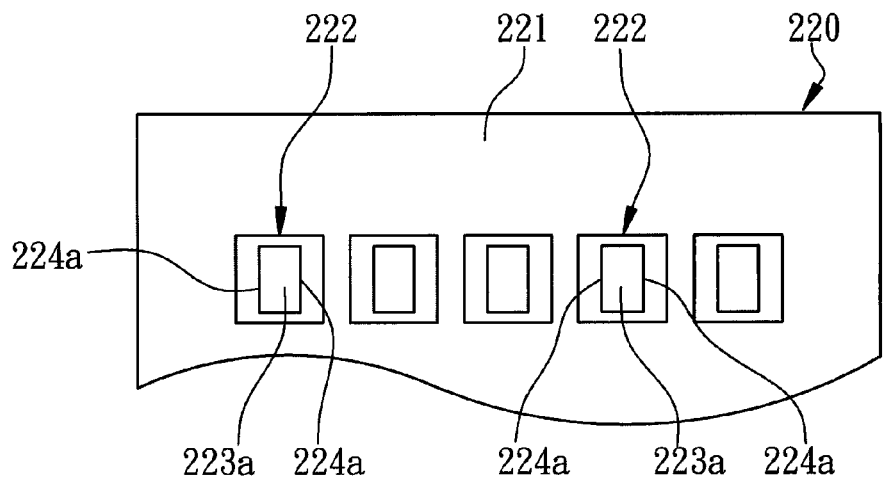
Figure 5C:
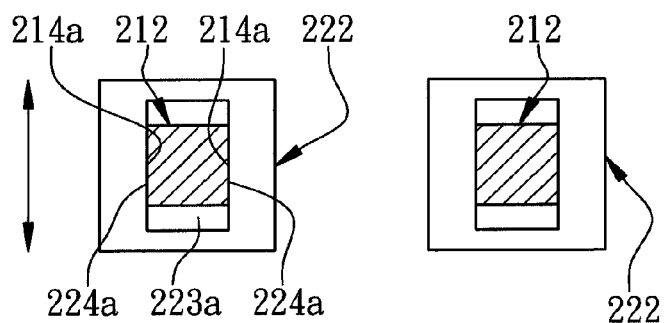

A variation embodiment of the invention is also revealed from FIG. 5A to FIG. 5C for top views of the metal pillars and the bonding pads of the metal post chip connecting device 200 to further explain the shapes of the end surfaces of the metal pillars as well as the shapes of the concaved bottom surfaces of the bonding pads which is illustrated but not limited. As shown in FIG. 5A, the end surface 213a of each metal pillar 212 is a square having two pairs of parallel sidewalls 214a with equal lengths. As shown in FIG. 5B, the cavity of each bonding pad 222 is like a closed groove having two concaved sidewalls as well as another pair of parallel sidewalls without different lengths. Furthermore, the shape of the concaved bottom surface 223a of the bonding pads 222 is a rectangle and the dimension of the concaved bottom surfaces 223a of the bonding pads 222 can be greater than the end surfaces 213a of the metal pillars 212 to enhance self-soldering of the end surfaces 213a of the metal pillars 212 to the concaved bottom surfaces 223a. Moreover, the shorter sides of the concaved bottom surfaces 223a, i.e., the distance between two concaved sidewalls 224a of the bonding pads 222, is not greater than the corresponding length of the end surfaces 213a of the metal pillars 212, i.e., the distance between two parallel sidewalls 214a of the metal pillars 212. Therefore, according to the vibration direction of the ultrasonic power as pointed by the arrow during flip-chip bonding of the chip 210 to the substrate 220 as shown in FIG. 5C, two parallel sidewalls 214a of the metal pillars 212 rub against two corresponding concaved sidewalls 224a through high-frequency vibration to enhance self-soldering of two parallel sidewalls 214a of the metal pillars 212 to two concaved sidewalls 224a.

Figure 6:
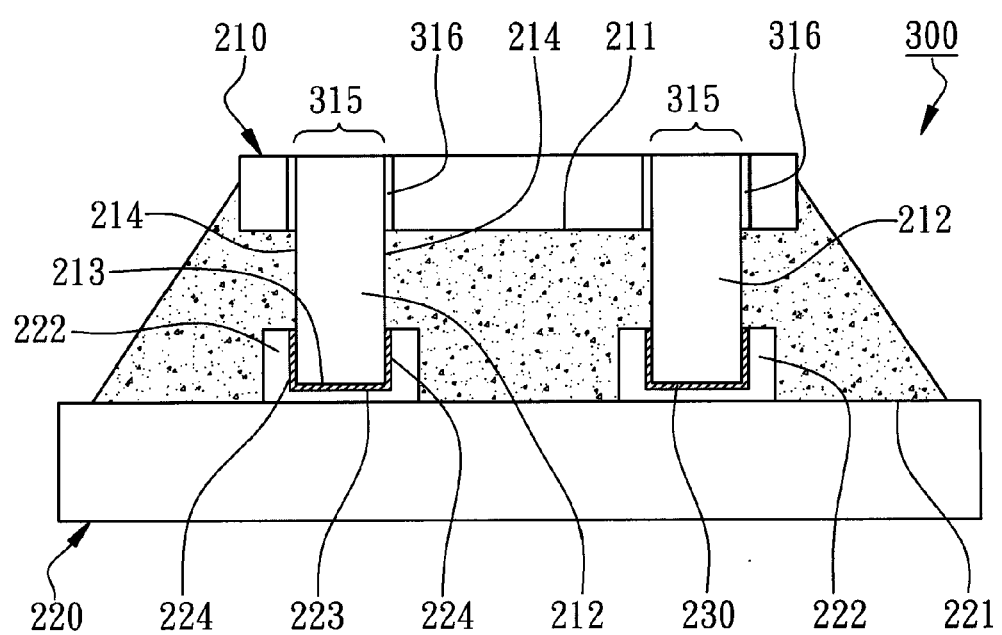
FIG. 6 is a cross-sectional view of another metal post chip connecting device according to the second embodiment of the present invention.

According to the second embodiment of the present invention, another metal post chip connecting device 300 without soldering materials is illustrated in FIG. 6 for a cross-sectional view where the major components with the described numbers are the same as the first embodiment without further description in detail.

As shown in FIG. 6, the metal post chip connecting device 300 primarily comprises a chip 210 and a substrate 220. A plurality of metal pillars 212 are disposed on and extruded from a surface 211 of the chip 210 where each metal pillar 212 has an end surface 213 and two parallel sidewalls 214. The substrate 220 has an upper surface 221 with a plurality of bonding pads 222 disposed on the upper surface 221 where each bonding pad 222 has a concaved bottom surface 223 and two concaved sidewalls 224. The chip 220 is flip-chip bonded onto the upper surface 221 of the substrate 220 where the end surfaces 213 of the metal pillars 212 self-solder to the concaved bottom surfaces 223 and two parallel sidewalls 214 of the metal pillars 212 partially self-solder to two concaved sidewalls 224 to form U-shape cross-sections of metal bonding 230 between the metal pillars 212 and the bonding pads 222. Preferably, the metal pillars 212 further penetrate through the chip 210. Furthermore, a plurality of through holes 315 are formed at the locations where the metal pillars 212 penetrate through the chip 210. A plated layer 316 is disposed on the sidewall of each through hole 315 where the plated layer 316 is formed by conductive materials such as copper. To be in more detail, the through holes 315 are through silicon via (TSV). By means of the metal pillars 212 penetrating through the chip 210, vertical electrical connections can be provided and the metal pillars 212 can be firmly fixed to assist the transmission of ultrasonic power from the chip 210 to the metal pillars 212 and to enhance the formation of U-shape cross-sections of metal bonding 230. In the present embodiment, the extruded surface 211 of the metal pillars 212 can be on the back surface of the chip 210 where the active surface opposing to the surface 211 is away from the substrate 220 to achieve better thermal dissipation. Furthermore, the exposed terminals of the metal pillars 212 can be implemented to vertically stack another chip.

The above description of embodiments of this invention is intended to be illustrative but not limited. Other embodiments of this invention will be obvious to those skilled in the art in view of the above disclosure which still will be covered by and within the scope of the present invention even with any modifications, equivalent variations, and adaptations.

What is claimed is:

1. A metal post chip connecting device free to use soldering material comprising:
    a chip with a plurality of metal pillars protrusively disposed on a surface of the chip, wherein each metal pillar has an end surface and two parallel sidewalls; and
    a substrate having an upper surface and a plurality of bonding pads disposed on the upper surface, wherein each bonding pad has a concaved bottom surface and two concaved sidewalls;
    when the chip is bonded onto the upper surface of the substrate, the end surfaces of the metal pillars self-solder to the concaved bottom surfaces and two parallel sidewalls of the metal pillars partially self-solder to the concaved sidewalls to form U-shape cross-sections of metal bonding between the metal pillars and the bonding pads.

2. The device as claimed in claim 1, wherein the U-shape cross-sections of metal bonding are copper-to-copper interfaces.

3. The device as claimed in claim 1, wherein the surface of the chip is an active surface.

4. The device as claimed in claim 1, wherein the metal pillars penetrate through the chip.

5. The device as claimed in claim 1, further comprising an underfill material formed between the chip and the substrate to encapsulate the metal pillars.

6. The device as claimed in claim 1, wherein the cavity depth of the bonding pads is not greater than one-third of the height of the metal pillar.

7. A manufacturing method for a metal post chip connecting device free to use soldering material comprising:
    providing a chip with a plurality of metal pillars protrusively disposed on an surface of the chip, wherein each metal pillar has an end surface and two parallel sidewalls;
    providing a substrate having an upper surface and a plurality of bonding pads disposed on the upper surface, wherein each bonding pad has a concaved bottom surface and two concaved sidewalls; and
    bonding the chip onto the upper surface of the substrate by using heat, pressure, and ultrasonic power exerted on the chip so that the end surfaces of the metal pillars self-solder to the concaved bottom surfaces and two parallel sidewalls of the metal pillars partially self-solder to the concaved sidewalls to form U-shape cross-sections of metal bonding between the metal pillars and the bonding pads.

8. The method as claimed in claim 7, wherein the U-shape cross-sections of metal bonding are copper-to-copper interfaces.

9. The method as claimed in claim 7, wherein the surface of the chip is an active surface.

10. The method as claimed in claim 7, wherein the metal pillars penetrate through the chip.

* * * * *